United States Patent
Seo et al.

(10) Patent No.: US 8,428,193 B2
(45) Date of Patent: Apr. 23, 2013

(54) BROADBAND WIRELESS SYSTEM

(75) Inventors: Won Gi Seo, Daejeon (KR); Seock Yong Son, Daejeon (KR); Dong Hwan Shin, Daejeon (KR)

(73) Assignee: Nextwill Co., Ltd., Daejeon (KR)

( * ) Notice: Subject to any disclaimer, the term of this patent is extended or adjusted under 35 U.S.C. 154(b) by 76 days.

(21) Appl. No.: 13/130,021

(22) PCT Filed: Dec. 9, 2010

(86) PCT No.: PCT/KR2010/008809
§ 371 (c)(1),
(2), (4) Date: May 18, 2011

(87) PCT Pub. No.: WO2011/074832
PCT Pub. Date: Jun. 23, 2011

(65) Prior Publication Data
US 2011/0249761 A1    Oct. 13, 2011

(30) Foreign Application Priority Data
Dec. 17, 2009   (KR) .................... 10-2009-0126448

(51) Int. Cl.
*H03K 9/00*   (2006.01)
*H04L 27/00*   (2006.01)

(52) U.S. Cl.
USPC ....................................................... 375/316

(58) Field of Classification Search ............. 375/316
See application file for complete search history.

(56) References Cited

U.S. PATENT DOCUMENTS

| | | | |
|---|---|---|---|
| 2009/0247106 A1* | 10/2009 | Da Graca et al. | 455/240.1 |
| 2010/0052967 A1* | 3/2010 | Currivan et al. | 341/155 |

FOREIGN PATENT DOCUMENTS

| | | |
|---|---|---|
| KR | 10-0288196 B1 | 4/2001 |
| KR | 10-0749899 B1 | 8/2007 |
| KR | 10-0999376 B1 | 12/2010 |
| WO | WO 2007/145637 A1 | 12/2007 |

OTHER PUBLICATIONS

English language Abstract of KR10-2000-0059488 A, the publication of KR10-0288196 B1.
English language Abstract of KR10-2005-0016200 A, the publication of KR10-0749899 B1.
English language Abstract of KR 10-0999376 B1.

* cited by examiner

*Primary Examiner* — David C. Payne
*Assistant Examiner* — Tanmay Shah
(74) *Attorney, Agent, or Firm* — Rabin & Berdo, P.C.

(57) ABSTRACT

A broadband wireless system includes an antenna receiving a broadband wireless signal, a reception unit receiving and processing the broadband wireless signal from the antenna and converting the broadband wireless signal into a first intermediate frequency signal, a signal distribution unit converting a first intermediate frequency signal into second intermediate frequency signals which are equal to one another, a parallel amplification unit generating third intermediate frequency signals which are obtained by amplifying the individual second intermediate frequency signals provided from the signal distribution unit with different amplification rates, a parallel analog-to-digital conversion unit performing analog-to-digital conversion of the individual third intermediate frequency signals from the parallel amplification unit and generating discrete intermediate frequency signals, and an execution system selecting any one of the individual discrete intermediate frequency signals by analyzing the individual discrete intermediate frequency signals from the analog-to-digital conversion unit and processing the selected individual discrete intermediate frequency signal.

2 Claims, 3 Drawing Sheets

BROADBAND WIRELESS SYSTEM

TECHNICAL FIELD

The present invention relates to a broadband wireless system, and more particularly to a broadband wireless system which has a high bit resolution and a wide operating range, enables measurement and use of signal specifications such as an arrival time, strength, frequency, pulse width, modulation type of a signal, has a simple configuration with high reliability, and enables easy use of the processed signal.

BACKGROUND ART

Recently, with the rapid development of communication techniques, the requirement level of data processing capability and processing speed of a communication system has been greatly heightened. In particular, a communication system which can process an enormous amount of data at a high speed with respect to broadband signals is required. For example, in order to develop a fourth generation mobile communication system, a high resolution radar system, a broadband system, a military system, a wireless system and a signal processing method that can meet such requirement are necessary.

In general, a broadband signal processing technique is a technique that can easily acquire information included in a signal having a bandwidth of several gigahertz (GHz) or more through digitalization and processing of the signal. In the fourth generation mobile communication system, the broadband signal processing technique enables a large capacity multimedia service through high-speed data transmission, and in the radar system, the broadband signal processing technique may be used to improve detection capability according to high-resolution implementation. An important condition among diverse conditions for such broadband signal processing is that the signal processing system has a capability of processing a wide bandwidth or diverse narrowband signals constituting the bandwidth at a high speed and a wide dynamic range.

In particular, in the broadband signal processing system, it is required that the operating range of the system accommodates all narrowband signals having different signal sizes in a broadband signal that is composed of a plurality of narrowband signals. Further, the broadband signal processing system should have a wide operating range and a high bit resolution. In the existing wireless system, the bit resolution should be lowered to secure the operating range, or the operating range should be narrowed to heighten the bit resolution. However, for effective processing of the broadband signal and development of a system or service using this, the development of a system having a high bit resolution and a wide operating range should precede.

Further, since the broadband signal processing system can be applied to not only a general communication system such as a mobile communication system but also diverse systems including a radar system, an astronomical observation system, a weather forecast system, a satellite communication system, and the like, the broadband signal processing system should have high bit resolution in addition to the wide operating range. Moreover, it is required that the broadband signal processing system can process even a very short signal accurately and rapidly through the high bit resolution and measure signal specifications which are inherent characteristics of a signal that can be used to analyze the arrival time, strength, frequency, pulse width, and modulation type of a received signal.

That is, the broadband signal processing system should be a system which can measure the signal specifications while it maintains a wide operating range and a high bit resolution in addition to a simply wide operating range of the existing system. Further, the broadband signal processing system requires an inexpensive price, simple configuration, easy of data processing, and high reliability of the signal processing apparatus and method so that it can be easily used in a broad field while maintaining the above-described characteristics.

DISCLOSURE

Technical Problem

Therefore, the present invention has been made in view of the above-mentioned problems, and the present invention provides a broadband wireless system which has a high bit resolution and a wide operating range, enables real-time measurement and use of signal specifications such as an arrival time, strength, frequency, pulse width, modulation type of a signal, has a simple configuration with high reliability, and enables easy use of the processed signal.

Technical Solution

In accordance with an aspect of the present invention, there is provided a broadband wireless system for receiving and processing a broadband wireless signal including: an antenna receiving the broadband wireless signal; a reception unit receiving and processing the broadband wireless signal from the antenna and converting the broadband wireless signal into a first intermediate frequency signal; a signal distribution unit converting the first intermediate frequency signal into second intermediate frequency signals which are equal to one another and distributing the second intermediate frequency signals; a parallel amplification unit generating third intermediate frequency signals which are obtained by amplifying the individual second intermediate frequency signals of the second intermediate frequency signal provided from the signal distribution unit with different amplification rates; a parallel analog-to-digital conversion unit performing analog-to-digital conversion of the individual third intermediate frequency signals of the third intermediate frequency signal from the parallel amplification unit and generating discrete intermediate frequency signals; and an execution system selecting any one of the individual discrete intermediate frequency signals by analyzing the individual discrete intermediate frequency signals of the discrete intermediate frequency signal from the analog-to-digital conversion unit and processing the selected individual discrete intermediate frequency signal.

The parallel amplification unit may include a plurality of amplification units having the different amplification rates and connected to the signal distribution unit to receive and amplifying the individual second intermediate frequency signal.

The parallel analog-to-digital conversion unit may include a plurality of analog-to-digital converters individually connected to the plurality of amplification units to convert the individual third intermediate frequency signals which are obtained by amplifying the individual second intermediate frequency signals.

The execution system may perform the selection by comparing whether the most significant bit of the individual intermediate frequency signal has been recorded, whether the least significant bit of the individual intermediate frequency signal has been recorded, or the sizes of the individual discrete intermediate frequency signals.

ADVANTAGEOUS EFFECTS

The broadband wireless system according to the present invention has a high bit resolution and a wide operating range, and enables real-time measurement and use of signal specifications such as an arrival time, strength, frequency, pulse width, modulation type of a signal. Further, the broadband wireless system according to the present invention has a simple configuration with high reliability, and enables easy use of the processed signal.

BRIEF DESCRIPTION OF THE DRAWINGS

The foregoing and other objects, features and advantages of the present invention will become more apparent from the following detailed description when taken in conjunction with the accompanying drawings in which.

BEST MODE

Mode for Invention

Figure 1:
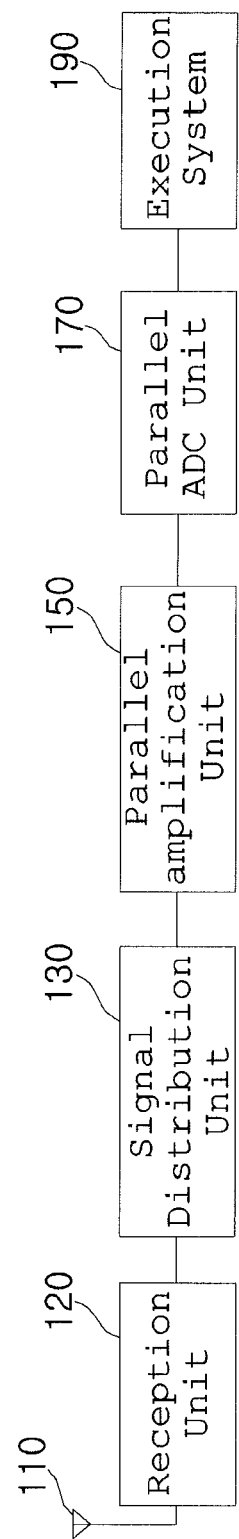
FIG. 1 is an exemplary diagram illustrating the configuration of a broadband wireless system according to an embodiment of the present invention.

Hereinafter, exemplary embodiments of the present invention will be described with reference to the accompanying drawings. In the following description, the same elements will be designated by the same reference numerals although they are shown in different drawings. Further, in the following description of the present invention, a detailed description of known functions and configurations incorporated herein will be omitted when it may make the subject matter of the present invention rather unclear. In the drawing, certain features presented in the drawings are expanded, reduced, or simplified for easy explanation, and the drawings and the constituent elements may not be appropriately illustrated. However, those of ordinary skill in the art could easily understand such detailed matters.

FIG. 1 is an exemplary diagram illustrating the configuration of a broadband wireless system according to an embodiment of the present invention.

Referring to FIG. 1, a broadband wireless system according to an embodiment of the present invention includes an antenna 110, a reception unit 120, a signal distribution unit 130, a parallel amplification unit 150, a parallel analog-to-digital conversion unit 170, and an execution system 190.

The antenna 110 receives a broadband wireless signal (RF) and transfers the received broadband wireless signal to the reception unit 120.

The reception unit 120 receives and processes the broadband wireless signal (RF) transferred from the antenna 110 and converts the broadband wireless signal (RF) into a first intermediate frequency signal (IF) that is an intermediate frequency signal of which the amplification is easy through the signal processing. The reception unit 120 may be configured by a broadband element or a broadband circuit for reception and processing of the broadband wireless signal (RF), but the present invention is not limited thereto.

The signal distribution unit 130 provides second intermediate frequency signals IF_M: IF1, IF2, . . . , and IFn, which are generated by converting the first intermediate frequency signal IF that is transferred from the reception unit into the second intermediate frequency signals which are equal to one another, to the parallel amplification unit 150. Ideally, the signal distribution unit 130 uniformly distributes the first intermediate frequency signal IF into the signals which are equal to one another. However, in an actual apparatus, due to a self-loss of the signal distribution unit 130, the individual second intermediate frequency signals IF1, IF2, . . . , and IFn, which are converted into the plurality of signals, may be signals in which the first intermediate frequency signal IF is attenuated by the loss. However, the present invention is not limited thereto.

The parallel amplification unit 150 transfers third intermediate frequency signals IF_MG: IF1_MG, IF2_MG, . . . , and IFn_MG, which are obtained by amplifying the individual second intermediate frequency signals IF1, IF2, . . . , and IFn of the second intermediate frequency signal IF_M, that is, the first intermediate frequency signal IF, with differently set amplification rates, to the parallel analog-to-digital conversion unit 170.

The parallel analog-to-digital conversion unit (hereinafter referred to as a "parallel ADC unit") 170 performs analog-to-digital conversion of the individual third intermediate frequency signal IF1_MG, IF2_MG, IF3_MG, . . . , and IFn_MG of the third intermediate frequency signal IF_MG, and generates and provides discrete intermediate frequency signals IF_D: IF1_D, IF2_D, . . . , and IFn_D to the execution system 190.

The execution system 190 discriminates saturation, normality, and insufficiency of the signals by analyzing the individual discrete intermediate frequency signals IFIF1_D, IF2_D, . . . , and IFn_D of the discrete intermediate frequency signal IF_D provided from the parallel ADC unit 170, and selects a normal signal to perform data processing. For this, the execution system 190 includes a signal selection unit 191 discriminating the saturation and insufficiency of the signals that constitute the discrete intermediate frequency signal IF_D and selecting the normal signal, and a data processing unit 193 processing the signal selected by the signal selection unit 191.

Securing of a wide operating range and analysis of signal specifications performed by the broadband wireless system according to an embodiment of the present invention will be described in more detail with reference to the following drawings.

Figure 2:
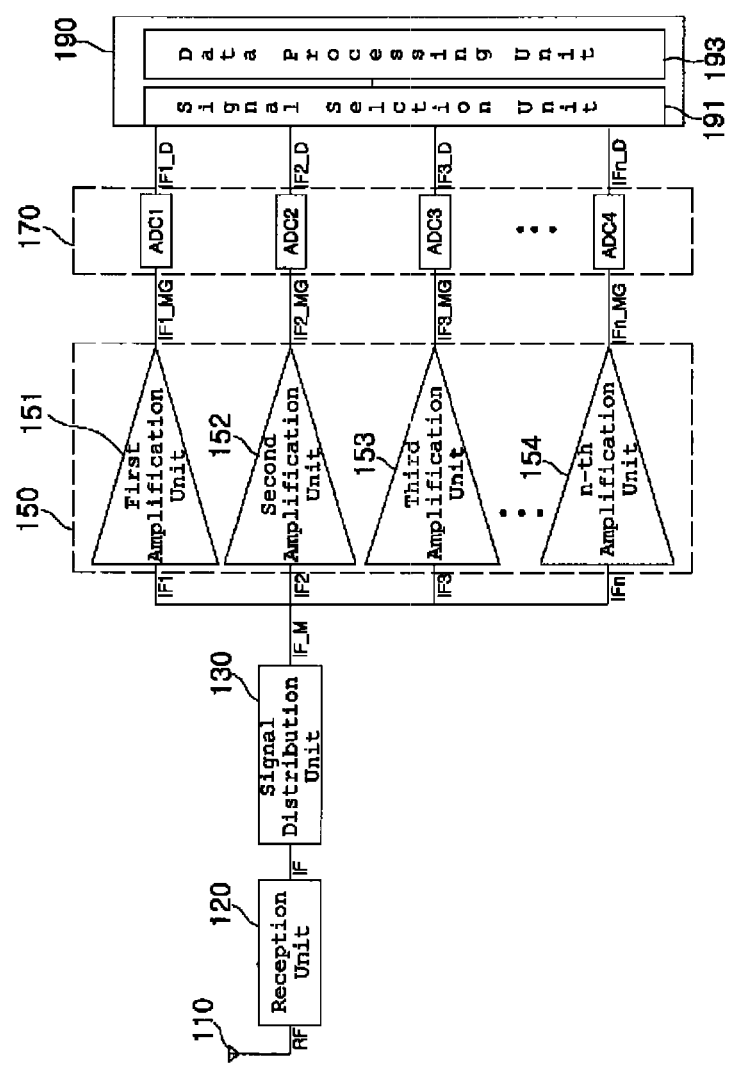
FIG. 2 is an exemplary diagram illustrating in more detail the configuration of the broadband wireless system of FIG. 1.
Figure 3:
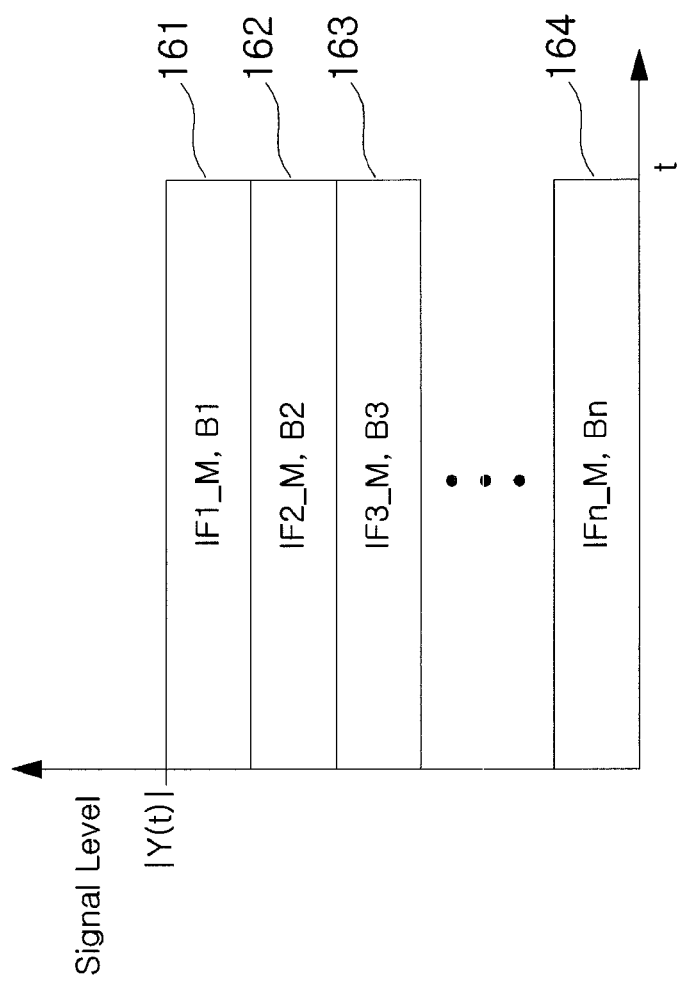
FIG. 3 is an exemplary diagram illustrating the operation of the broadband wireless system according to an embodiment of the present invention.

FIG. 2 is an exemplary diagram illustrating in more detail the configuration of the broadband wireless system of FIG. 1, and FIG. 3 is an exemplary diagram illustrating the operation of the broadband wireless system according to an embodiment of the present invention.

Referring to FIGS. 2 and 3, the broadband wireless system according to an embodiment of the present invention includes the antenna 110, the reception unit 120, the signal distribution unit 130, the parallel amplification unit 150, the parallel analog-to-digital conversion unit 170, and the execution system 190. Among them, the parallel amplification unit 150 includes a plurality of amplification units 151 to 154 having the different amplification rates, and the parallel ADC unit 170 includes a plurality of analog-to-digital converters (ADC) ADC1 to ADCn.

The signal distribution unit 130, as described above, uniformly distributes the first intermediate frequency signal IF provided from the reception unit 120, and generates the second intermediate frequency signal IF_M which includes a plurality signals. The second intermediate frequency signal IF_M is composed of a plurality of individual second intermediate frequency signals IF1, IF2, IF3, . . . , and IFn which are equal to the first intermediate frequency IF in the case where a loss of the signal distribution unit 130 is not considered. The individual second intermediate frequency signals IF1, IF2, IF3, . . . , and IFn of the second intermediate frequency signal IF_M are provided to the parallel amplification unit 150 and amplified with different amplification rates.

For this, the parallel amplification unit 150 is composed of first to n-th amplification units 151 to 154 having different amplification rates G1 to G4. The first to n-th amplification units 151 to 154 amplify the individual second intermediate frequency signals IF1, IF2, IF3, . . . , and IFn of the second intermediate frequency signal IF_M, and transfer the individual third intermediate frequency signals IF1_M, IF2_M, . . . , and IFn_M of the third intermediate frequency signal IF_M amplified and generated to the parallel ADC unit 170.

Here, if the broadband wireless signal is defined as a time function X(f1), the first intermediate frequency signal IF converted by the reception unit 120 may be expressed as in Equation (1).

$$Y(t) = A \times [X(f1-f2)] \qquad (1)$$

Here, Y(t) denotes a function for the first intermediate frequency signal, A denotes an amplification rate of the reception unit 120, f2 means a local frequency used in the reception unit 120. Accordingly, the first intermediate frequency signal IF that is expressed by Y(t) is a down-converted signal that is obtained by subtracting the local frequency f2 from the frequency f1 of the wireless signal RF.

If the first intermediate frequency signal IF is converted into the second intermediate frequency signal IF_M through the signal distribution unit 130, the second intermediate frequency signal IF_M may be expressed as in Equation (2).

$$Y(t) = A \times L \times [X(f1-f2)] \qquad (2)$$

Here, i denotes a natural number from 1 to n, and L means a loss by the signal distribution unit.

Also, the third intermediate frequency signal IF_MG which is amplified and generated by the parallel amplification unit 150 may be expressed as in Equation (3) on the assumption that the amplification rate of the first to n-th amplification units 151 to 154 of the parallel amplification unit 150 is $B_i$ (where, i denotes a natural number from 1 to n).

$$Y(t) = A \times B_i \times L \times [X(f1-f2)] \qquad (3)$$

As can be seen from this equation, it can be known that the difference between the individual third intermediate frequency signal IF1_MG that is amplified by the first amplification unit 151 and the third intermediate frequency signal IF2_MG that is amplified by the second amplification unit 152 is caused by the amplification rates B1 and B2. That is, by making the amplification rates of the respective amplification units 151 to 154 different from one another, the broadband wireless signal can be divided into predetermined regions, and signals in the divided regions can be processed by the respective amplification units 151 to 154 and the ADC ADC1 to ADCn.

FIG. 3 is an exemplary diagram illustrating the operation of the broadband wireless system according to an embodiment of the present invention.

As illustrated in FIG. 3, the first intermediate frequency signal FI may be dividedly processed by the amplification units 151 to 154 having different amplification rates $B_i$: B1 to Bn. In other words, by dividing one signal band into several regions as illustrated in FIG. 3, it is possible to adopt several elements which are inexpensive and have a relatively low speed and a narrow operating range in replacement of a single element having a wide operating range and high bit resolution.

Specifically, the operating range of the broadband wireless system is represented as the sum of the wireless signal and intermediate frequency operating range of the reception unit 120 and the operating range of the ADC. According to the present invention, the reception unit 120 and the signal distribution unit 130 are implemented using a broadband high-speed operating element or device to prevent the complexity of the circuit from increasing, and low-speed and inexpensive devices are used in the remaining signal processing portion. Accordingly, the circuit complexity and cost are reduced, and the reliability of operation is improved.

In particular, in the case where the wireless system performs amplification with a fixed gain, it is general that the ADC input level is optimized at the maximum reception level of the wireless signal. The execution system 190 can accurately measure the signal specifications by such a fixed gain. However, if the level of the received signal is lowered, the effective bits of the ADC are decreased, the bit resolution is lowered, and the operating range is reduced due to the reduction of the effective bits.

However, according to the present invention, since the received signal, that is, the wireless signal, is divided into several regions and a plurality of parallel amplifiers having fixed amplification rates $B_i$ is used, the amplification units 151 to 154 and the ADC ADC1 to ADC4, which can relatively optimize the input level even if the level of the received signal is lowered, are configured to prevent the reduction of the effective bits. That is, in the case of a wireless system in the related art, which uses one amplification unit having a fixed gain, the effective bits and bit resolution deteriorate when the wireless signal is received in a low signal level region 164. By contrast, according to the present invention, in the low signal level region 164 as illustrated in FIG. 3, signals of the amplification unit 164 and the ADC ADC4, which are optimized to the region, are used, and it is possible to secure consistently uniform bit resolution and operating range regardless of the signal level.

According to the present invention, the amplification rates of the first to fourth amplification units 151 to 154 and the number of divided regions are determined according to the performance of the ADC ADC1 to ADCn which play an important part in determining the operating range. That is, in the case where the bit resolution of the ADC is high and the analog-to-digital conversion performance is superior, the number of amplification units becomes smaller, and in the opposite case, a larger number of amplification units may be configured. Moreover, the regions which are defined by the respective amplification units 151 to 154 and the ADC ADC1 to ADC4 may be set to partially overlap one another. However, the present invention is not limited thereto.

On the other hand, the discrete intermediate frequency signals IF_D output from the parallel ADC unit 170 are simultaneously output and provided to the execution system 190. The execution system should select a signal that is appropriate for data processing among the plurality of individual discrete intermediate frequency signals IF_D: IF1_D to IFn_D provided simultaneously.

For this, as described above, the execution system 190 is configured to include the signal selection unit 191 that is implemented by a logic circuit or a signal processing algorithm. This signal selection unit 191 selects a signal to be used for data processing through comparison of the most significant bit (MSB) and the least significant bit (LSB) of the discrete intermediate frequency signals IF_D, and sizes of the amplified signals.

More specifically, if the signal level of the broadband wireless signal RF, X(f) is very low, the first discrete intermediate signal IF1_D, which is an output of the first amplification unit 151 and the first ADC ADC1, is output at the highest level, and other outputs are lower than this output. In this case, the signal selection unit selects the output of the first ADC ADC1, and provides the selected first discrete intermediate frequency signal IF1_D to the data processing unit 193 to perform the date processing.

By contrast, if the signal level of the broadband wireless signal RF, S(f) is very high, output signals except for the n-th discrete intermediate frequency signal IFn_D which is the output of the n-th amplification unit 154 and the n-th ADC ADCn are saturated. At this time, the signal selection unit 191 selects and transfers the n-th discrete intermediate frequency signal to the data processing unit 193. At this time, whether the signals are saturated is determined according to whether the MSB has been recorded. Further, the comparison of the sizes of the output discrete intermediate frequency signal IF_D can be easily performed by determining whether the MSB and LSB have been recorded.

As described above, according to the present invention, the signal process can be performed rapidly and accurately regardless of the level of the received signal in the broadband wireless signal, and it is possible to maintain the high bit resolution. Moreover, even in the case where the amplification is performed, the amplification is performed with a fixed gain, and since the system has a uniform delay time, it becomes possible to calculate the signal specifications of the wireless signal RF and to secure a wide operating range.

Industrial Applicability

Although several exemplary embodiments of the present invention have been described for illustrative purposes, those skilled in the art will appreciate that various modifications, additions and substitutions are possible, without departing from the scope and spirit of the invention as disclosed in the accompanying claims.

The invention claimed is:

1. A broadband wireless system for receiving and processing a broadband wireless signal comprising:
   an antenna receiving the broadband wireless signal;
   a reception unit receiving and processing the broadband wireless signal from the antenna and converting the broadband wireless signal into a first intermediate frequency signal;
   a signal distribution unit converting the first intermediate frequency signal into second intermediate frequency signals which are equal to one another, the signal distribution unit distributing the second intermediate frequency signals;
   a parallel amplification unit including a plurality of amplification units having different amplification rates, the parallel amplification unit generating third intermediate frequency signals by amplifying the individual second intermediate frequency signals provided from the signal distribution unit with the different amplification rates;
   a parallel analog-to-digital conversion unit performing analog-to-digital conversion of the individual third intermediate frequency signals from the parallel amplification unit and generating discrete intermediate frequency signals; and
   an execution system selecting any one of the individual discrete intermediate frequency signals by analyzing the individual discrete intermediate frequency signals from the analog-to-digital conversion unit and processing the selected individual discrete intermediate frequency signal;
   wherein the execution system performs the selection by analyzing the most significant bit, and the least significant bit, of the individual discrete intermediate frequency signals.

2. A broadband wireless system as claimed in claim 1, wherein the parallel analog-to-digital conversion unit comprises a plurality of analog-to-digital converters individually connected to the plurality of amplification units to convert the individual third intermediate frequency signals which are obtained by amplifying the individual second intermediate frequency signals.

* * * * *